United States Patent
Hong

(10) Patent No.: US 11,282,570 B2
(45) Date of Patent: Mar. 22, 2022

(54) STORAGE DEVICE AND METHOD OF OPERATING THE SAME

(71) Applicant: SK hynix Inc., Gyeonggi-do (KR)

(72) Inventor: Jiman Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/036,853

(22) Filed: Sep. 29, 2020

(65) Prior Publication Data

US 2021/0383862 A1 Dec. 9, 2021

(30) Foreign Application Priority Data

Jun. 9, 2020 (KR) .................. 10-2020-0069433

(51) Int. Cl.
*G11C 11/56* (2006.01)
*G11C 16/34* (2006.01)
*G11C 16/10* (2006.01)
*G11C 16/04* (2006.01)

(52) U.S. Cl.
CPC ...... *G11C 11/5628* (2013.01); *G11C 11/5671* (2013.01); *G11C 16/0483* (2013.01); *G11C 16/10* (2013.01); *G11C 16/3459* (2013.01)

(58) Field of Classification Search
CPC .................................................. G11C 11/5628
See application file for complete search history.

(56) References Cited

U.S. PATENT DOCUMENTS

2012/0069674 A1* 3/2012 Lee .................. G11C 16/3459
365/185.19
2016/0148695 A1* 5/2016 Kim .................. G11C 29/42
365/185.03

FOREIGN PATENT DOCUMENTS

KR 10-2018-0062158 6/2018

\* cited by examiner

*Primary Examiner* — Douglas King
(74) *Attorney, Agent, or Firm* — IP & T Group LLP

(57) ABSTRACT

The present technology relates to an electronic device. More specifically, the present technology relates to a storage device and a method of operating the same. A memory device according to an embodiment includes a memory cell array including a plurality of memory cells, a peripheral circuit configured to perform a program operation, a program verifier configured to calculate difference values, each of which is between a first pass loop count and a second pass loop count of a respective one of program states, when the program operation is completed, and output a pass status or a fail status according to whether at least one of the difference values exceeds a reference value.

15 Claims, 11 Drawing Sheets

|  | First Pass Loop Count (PLC1) | Second Pass Loop Count (PLC2) | \|PLC1-PLC2\| |
|---|---|---|---|
| PV1 | x1 | y1 | y1-x1 |
| PV2 | x2 | y2 | y2-x2 |
| PV3 | x3 | y3 | y3-x3 |
| PV4 | x4 | y4 | y4-x4 |
| PV5 | x5 | y5 | y5-x5 |
| PV6 | x6 | y6 | y6-x6 |
| PV7 | x7 | y7 | y7-x7 |

STORAGE DEVICE AND METHOD OF OPERATING THE SAME

CROSS-REFERENCE TO RELATED APPLICATION

The present application claims priority under 35 U.S.C. § 119(a) to Korean patent application number 10-2020-0069433, filed on Jun. 9, 2020, which is incorporated herein by reference in its entirety.

BACKGROUND

1. Field of Invention

The present disclosure relates to an electronic device, and more particularly, to a storage device and a method of operating the same.

2. Description of Related Art

A storage device stores data under control of a host device. The storage device may include a memory device storing data and a memory controller controlling the memory device. The memory device may be a volatile memory device or a non-volatile memory device.

A volatile memory device may store data only while receiving power from a power source. When the power supply is cut off, the data stored in the volatile memory device may be lost. Examples of volatile memory devices include a static random access memory (SRAM), a dynamic random access memory (DRAM), and the like.

In a non-volatile memory device stored data is not lost even in the unpowered state. Examples of non-volatile memory devices include a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a storage device capable of preventing a read fail, and a method of operating the same.

A memory device according to an embodiment of the present disclosure may include a memory cell array including a plurality of memory cells, a peripheral circuit configured to perform a program operation of increasing a threshold voltage of the plurality of memory cells so that the threshold voltage of the plurality of memory cells is included in any one of a plurality of program states separated according to voltage magnitudes thereof, a loop count storage configured to store first pass loop counts and second pass loop counts for the plurality of program states, respectively, the program states being determined while the program operation is performed, and a program verifier configured to calculate difference values, each of which is between a first pass loop count and a second pass loop count of a respective one of the program states, when the program operation is completed, and output a result of the program operation indicating a pass status or a fail status according to whether at least one of the difference values exceeds a reference value.

A method of operating a memory device according to another embodiment of the present disclosure may include performing a program operation of increasing a threshold voltage of a plurality of memory cells so that the threshold voltage of the plurality of memory cells in a memory cell array is included in any one of a plurality of program states separated according to voltage magnitudes thereof, storing first pass loop counts and second pass loop counts for the plurality of program states, respectively, the program states being determined while the program operation is performed, calculating difference values, each of which is between the first pass loop count and the second pass loop count of a respective one of the program states, when the program operation is completed, and determining whether the program operation passed or failed according to whether at least one of the difference values exceeds a reference value.

A memory device according to an embodiment of the present disclosure may include a plurality of memory cells, a peripheral circuit configured to perform a program operation of increasing a threshold voltage of the plurality of memory cells so that the threshold voltage of the plurality of memory cells is included in any one of a plurality of program states separated according to voltage magnitudes thereof, and control logic configured to determine whether the program operation passed according to whether a difference between program loops in which a memory cell on which verify operations respectively corresponding to the plurality of program states passed is first sensed and program loops in which verification for each of the plurality of program states is completed exceeds a reference value, while the program operation is performed.

A memory device according to an embodiment of the present disclosure may include a memory cell array including a plurality of memory cells, a peripheral circuit configured to perform a program operation on the plurality of memory cells to indicate any one of a plurality of program states, the program operation including a plurality of program loops with different program voltages, and a program operation controller. The program operation controller configured to determine a first pass loop count and a second pass loop count for each of the plurality of program states, to calculate a difference value between corresponding first and second pass loop counts, and to determine whether the program operation passed or failed, based on difference values for the plurality of program states. The first pass loop count indicates a program loop in which a verify operation passed, among the program loops. The second pass loop count indicates a program loop in which a verification for a target program state is completed, among the program loops.

According to the present technology, a storage device capable of preventing a read fail, and a method of operating the same are provided.

DETAILED DESCRIPTION

Specific structural and functional description is provided herein for the purpose of describing embodiments of the present disclosure. The invention, however, may be carried out in various ways and implemented in various forms. Thus, the present invention is not limited to or by any of the disclosed embodiments, nor to any specific detail provided herein. Throughout the specification, reference to "an embodiment," "another embodiment" or the like is not necessarily to only one embodiment, and different references to any such phrase are not necessarily to the same embodiment(s).

Figure 1:
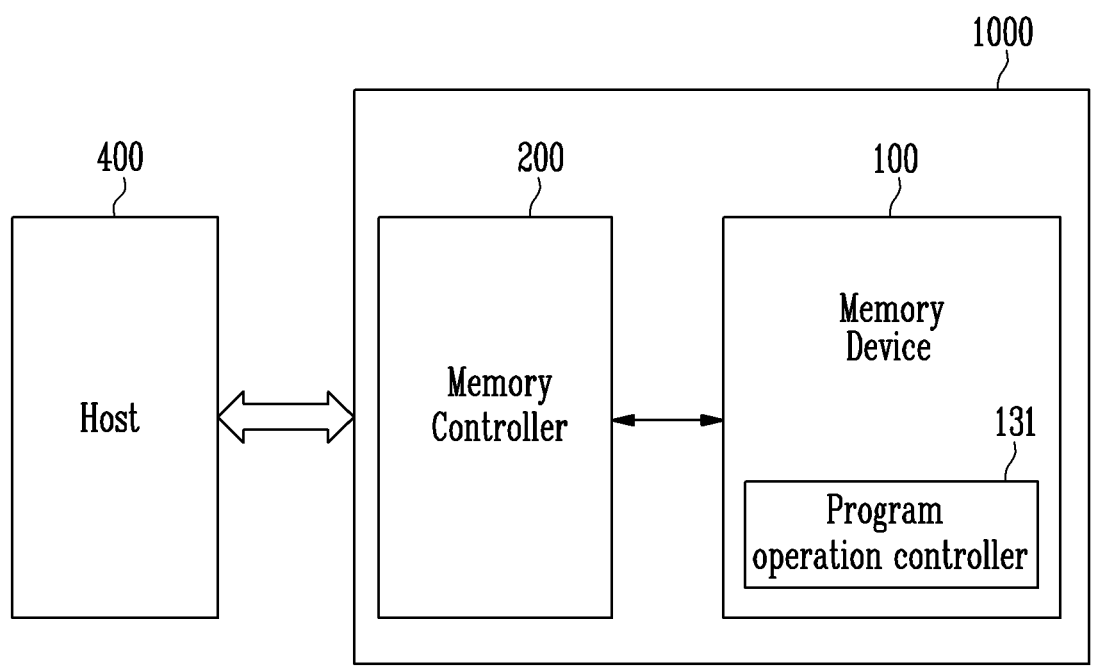
FIG. 1 is a diagram illustrating a storage system according to an embodiment of the present disclosure.

FIG. 1 is a diagram illustrating a storage system according to an embodiment of the present disclosure.

Referring to FIG. 1, the storage system may be implemented as a personal computer (PC), a data center, a corporate data storage system, a data processing system including a direct attached storage (DAS), a data processing system including a storage area network (SAN), a data processing system including a network attached storage (NAS), or the like.

The storage system may include a storage device 1000 and a host 400.

The storage device 1000 may store data under control of the host 400 such as a cellular phone, a smartphone, an MP3 player, a laptop computer, a desktop computer, a game player, a TV, a tablet PC, or an in-vehicle infotainment system.

The storage device 1000 may be manufactured or configured as any of various types of storage devices according to a host interface that defines the communication protocol with the host 400. For example, the storage device 1000 may be configured as any of an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-e or PCIe) card type storage device, a compact flash (CF) card, a smart media card, and a memory stick.

The storage device 1000 may be manufactured as any of various types of packages. For example, the storage device 1000 may be manufactured as any of a package on package (POP), a system in package (SIP), a system on chip (SOC), a multi-chip package (MCP), a chip on board (COB), a wafer-level fabricated package (WFP), and a wafer-level stack package (WSP).

The storage device 1000 may include a memory device 100 and a memory controller 200.

The memory device 100 may operate in response to control of the memory controller 200. Specifically, the memory device 100 may receive a command and an address from the memory controller 200 and access a memory cell selected by the address among memory cell arrays (not shown). The memory device 100 may perform an operation instructed by the command on the memory cell selected by the address.

The command may be, for example, a program command, a read command, or an erase command, and the operation instructed by the command may be, for example, a program operation (or a write operation), a read operation, or an erase operation.

For example, the memory device 100 may receive a program command, an address, and data, and program the data in a memory cell selected by the address.

For example, the memory device 100 may receive a read command and an address, and read data from an area selected by the address in the memory cell array.

For example, the memory device 100 may receive an erase command and an address, and erase data stored in an area selected by the address.

For example, the memory device 100 may be implemented as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory, a spin transfer torque random access memory (STT-RAM), or the like.

In the present specification, by way of example, the invention is described in the context in which the memory device 100 is a NAND flash memory.

The memory device 100 may store data under control of the memory controller 200 or provide the stored data to the memory controller 200.

The memory device 100 may include the memory cell array (not shown) including memory cells storing data.

The memory cell array (not shown) may include a plurality of memory blocks (not shown). A memory block may be a unit on which an erase operation of erasing data is performed.

The memory block may include a plurality of pages (not shown). The page may be a unit on which a program operation of storing data or a read operation of sensing stored data is performed.

The memory device 100 may include a program operation controller 131.

The program operation controller 131 may control the memory device 100 to perform a program operation of storing data in selected memory cells in response to a program command provided from the memory controller 200.

The program operation controller 131 may store a result of the program operation. The memory controller 200 may request the program operation result from the memory device 100. Further, the memory controller 200 may determine whether the program operation is successfully performed based on the program operation result received from the memory device 100.

The program operation may include increasing threshold voltages of the selected memory cells so that the threshold voltages of the selected memory cells are included in any one of a plurality of program states. A program state in which the memory cell is programmed may be determined according to data to be stored in a corresponding memory cell. That is, a target program state may be determined according to the data to be stored in the memory cell.

The program operation may be performed in a page unit. The page may be a plurality of memory cells connected to the same word line.

The number of program states may be determined according to the number of bits of data stored in the memory cell. For example, a memory cell may be configured as a single level cell (SLC) that stores 1 bit of data, a multi-level cell (MLC) that stores 2 bits of data, a triple level cell (TLC) that stores 3 bits of data, and a quadruple level cell (QLC) that stores 4 bits of data.

In an SLC, the target program state may be a first program state or a second program state. In an MLC, the target program state may be any one of first to fourth program states. In a TLC, the target program state may be any one of first to eighth program states. In a QLC, the target program state may be any one of first to sixteenth program states.

The program operation may include a plurality of program loops. A program loop may include a program voltage application operation and a verify operation.

The program voltage application operation may include applying a program voltage to a selected word line, which is a word line commonly connected to the selected memory cells.

The verify operation may include determining whether the threshold voltage of the memory cell reaches a target threshold voltage corresponding to the target program state. In the verify operation, a verify voltage corresponding to the target program state may be applied to the selected word line. When the threshold voltage of the memory cell is greater than the verify voltage, it may be determined that the verify operation passed. When the threshold voltage of the memory cell is less than or equal to the verify voltage, it may be determined that the verify operation e failed. When the verify operation on a set number of memory cells among memory cells having the same target program state is passed, verification for the corresponding target program state may be completed.

When verification for all target program states is completed, the program operation may be completed. When the program operation is completed, it may be determined that the program operation passed.

When the program operation has not passed within a set reference time, it may be determined that the program operation failed. Alternatively, when the program operation has not passed even after performing the maximum allowable number of program loops indicated by a set maximum loop count, it may be determined that the program operation failed.

According to an embodiment of the present disclosure, the program operation controller 131 may determine that the program operation failed even though the verification for all target program states is completed.

Specifically, while the program operation is performed, the program operation controller 131 may store first pass loop counts and second pass loop counts corresponding to each of the plurality of program states.

When the program operation is completed, the program operation controller 131 may calculate difference values between the first pass loop counts and the second pass loop counts. Further, the program operation controller 131 may determine whether the program operation passed or failed according to whether any of the difference values exceed a set reference value.

The first pass loop count may indicate a program loop in which memory cells on which the verify operation corresponding to each program state is passed are first sensed.

The second pass loop count may indicate a program loop in which the verification for the target program state is completed.

The program operation controller 131 is described in detail below with reference to FIG. 7.

The memory controller 200 may control overall operation of the storage device 1000.

When power is applied to the storage device 1000, the memory controller 200 may execute firmware. When the memory device 100 is a flash memory device, the firmware may include a host interface layer, a flash translation layer, and a flash interface layer.

The host interface layer may control an operation between the host 400 and the memory controller 200.

The flash translation layer may translate a logical address provided from the host 400 into a physical address. To this end, the memory controller 200 may store map data indicating relationship between the logical address and the physical address.

The flash interface layer may control communication between the memory controller 200 and the memory device 100.

The memory controller 200 may control the memory device 100 to perform the program operation, the read operation, and the erase operation, respectively, in response to a write request, a read request, and an erase request from the host 400.

During the program operation, the memory controller 200 may provide the program command, the physical addresses, and data to the memory device 100.

During the read operation, the memory controller 200 may provide the read command and the physical address to the memory device 100.

In the erase operation, the memory controller 200 may provide the erase command and the physical address to the memory device 100.

The memory controller 200 may generate the command, the addresses, and data autonomously without a request provided from the host 400. The memory controller 200 may transmit the autonomously generated command, address, and data to the memory device 100.

For example, the memory controller 200 may generate a command, an address, and data for performing a background operation. In addition, the memory controller 200 may provide the command, the address, and the data to the memory device 100.

The background operation may be wear leveling, read reclaim, and/or garbage collection.

The memory controller 200 may control two or more memory devices 100. In this case, the memory controller 200 may control the memory devices 100 according to an interleaving method to improve operation performance.

The interleaving method may be a method of performing control such that operations on two or more memory devices 100 overlap.

The host 400 may communicate with the storage device 1000 through an interface (not shown).

The interface may be implemented as a serial advanced technology attachment (SATA) interface, a SATA express (SATA express) interface, a serial attached small computer system interface (SAS) interface, a peripheral component interconnect express (PCIe) interface, a non-volatile memory express (NVMe) interface, an advanced host controller interface (AHCI), or a multimedia card interface. However, the interface is not limited thereto.

The host 400 may communicate with the storage device 1000 to store data in the storage device 1000 or obtain data stored in the storage device 1000.

In an embodiment, the host 400 may provide a write request to the storage device 1000 requesting that data be stored in the storage device 1000. In addition, the host 400 may provide a write request, data, and a logical address identifying data to be written (stored) in the storage device 1000.

The storage device 1000 may store the data provided by the host 400 in the memory device 100 in response to the write request provided from the host 400 and provide a response that the storage is completed to the host 400.

In an embodiment, the host 400 may provide a read request to the storage device 1000 requesting that data stored in the storage device 1000 be sent to the host 400. In addition, the host 400 may provide a read request and a read address to the storage device 1000.

The storage device 1000 may read data corresponding to the read address provided by the host 400 from the memory device 100 in response to the read request from the host 400 and provide the read data to the host 400 in response to the read request.

Figure 2:
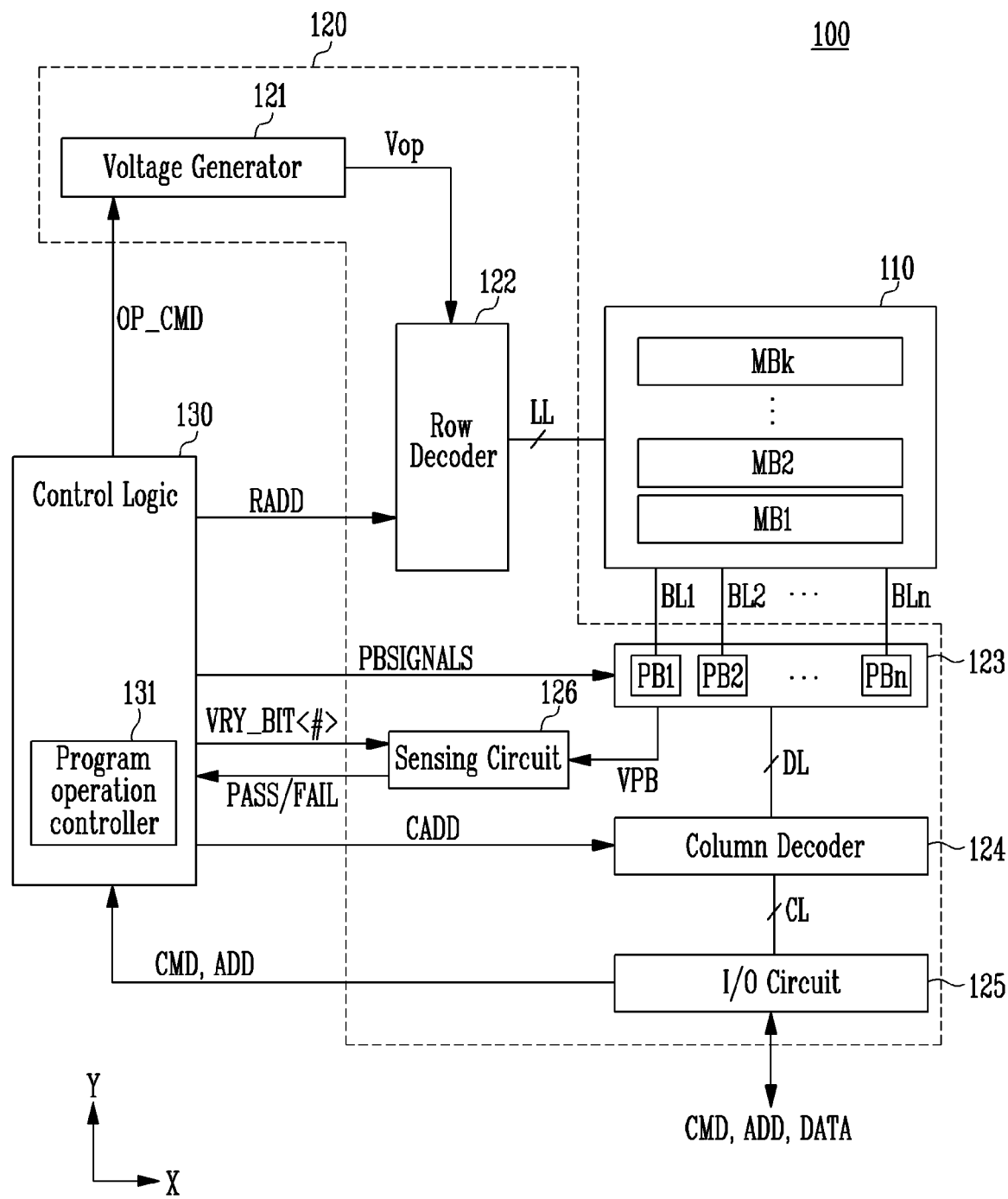
FIG. 2 is a diagram illustrating an embodiment of a memory device shown in FIG. 1.

FIG. 2 is a diagram for describing an embodiment of the memory device 100 shown in FIG. 1.

Referring to FIGS. 1 and 2, the memory device 100 may include a memory cell array 110, a peripheral circuit 120, and control logic 130.

The memory cell array 110 may include a plurality of memory blocks MB1 to MBk (where k is a positive integer).

Each of the memory blocks MB1 to MBk may be connected to local lines LL and bit lines BL1 to BLn (where n is a positive integer).

The local lines LL may be connected to each of the memory blocks MB1 to MBk.

Although not shown, the local lines LL may include a first select line, a second select line, and a plurality of word lines arranged between the first select line and the second select line.

Although not shown, the local lines LL may further include dummy lines arranged between the first select line and the word lines, dummy lines arranged between the second select line and the word lines, and pipelines.

The bit lines BL1 to BLn may be commonly connected to the memory blocks MB1 to MBk.

The memory blocks MB1 to MBk may be implemented as a two-dimensional or three-dimensional structure.

In the memory blocks MB1 to MBk of the two-dimensional structure, memory cells may be arranged in a direction parallel to a substrate.

In the memory blocks MB1 to MBk of the three-dimensional structure, memory cells may be stacked on a substrate in a vertical direction.

The peripheral circuit 120 may include a voltage generator 121, a row decoder 122, a page buffer group 123, a column decoder 124, an input/output (I/O) circuit 125, and a sensing circuit 126.

The voltage generator 121 may generate various operation voltages Vop used for the program operation, the read operation, and the erase operation in response to an operation signal OP_CMD. In addition, the voltage generator 121 may selectively discharge the local lines LL in response to the operation signal OP_CMD. For example, the voltage generator 121 may generate a program voltage, a verify voltage, pass voltages, a turn-on voltage, a read voltage, an erase voltage, a source line voltage, and the like under control of the control logic 130.

In an embodiment, the voltage generator 121 may regulate an external power voltage to generate an internal power voltage. The internal power voltage generated by the voltage generator 121 is used as an operation voltage of the memory device 100.

In an embodiment, the voltage generator 121 may generate a plurality of voltages using an external power voltage or an internal power voltage. For example, the voltage generator 121 may include a plurality of pumping capacitors that receive the internal power voltage, and may generate the plurality of voltages by selectively activating the plurality of pumping capacitors in response to the control of the control logic 130. The plurality of generated voltages may be supplied to the memory cell array 110 by the row decoder 122.

The row decoder 122 may transfer the operation voltages Vop to the local lines LL in response to a row address RADD. The operation voltages Vop may be transferred to a selected memory block through the local lines LL.

During the program operation, the row decoder 122 may apply the program voltage to selected word lines and a program pass voltage of a level less than that of the program voltage to unselected word lines. During the program verify operation, the row decoder 122 may apply the verify voltage to the selected word line and a verify pass voltage greater than the verify voltage to the unselected word lines.

During the read operation, the row decoder 122 may apply the read voltage to the selected word line, and apply a read pass voltage greater than the read voltage to the unselected word lines.

During the erase operation, the row decoder 122 may select one memory block according to a decoded address. Further, the row decoder 122 may apply a ground voltage to word lines connected to the selected memory block.

The page buffer group 123 may include first to n-th page buffers PB1 to PBn, which may be connected to the memory cell array 110 through the first to n-th bit lines BL1 to BLn, respectively. The first to n-th page buffers PB1 to PBn may operate in response to the control of the control logic 130.

Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read operation or the verify operation.

During the program operation, when the program voltage is applied to the selected word line, the first to n-th page buffers PB1 to PBn may transfer data DATA received through the column decoder 124 and the input/output circuit 125 to the selected memory cell through the first to n-th bit lines BL1 to BLn. The memory cells of the selected page are programmed according to the transferred data DATA. The memory cell connected to the bit line to which a program permission voltage (for example, a ground voltage) is applied may have an increased threshold voltage. The threshold voltage of the memory cell connected to the bit line to which a program inhibit voltage (for example, a power voltage) is applied may be maintained.

During the verify operation, the first to n-th page buffers PB1 to PBn may sense data stored in the memory cells selected through the first to n-th bit lines BL1 to BLn from the selected memory cells.

During the read operation, the first to n-th page buffers PB1 to PBn may sense the data DATA from the memory cells of the selected page through the first to n-th bit lines BL1 to BLn, and output the read data DATA to the input/output circuit 125 under the control of the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to a column address CADD. For example, the column decoder 124 may exchange data with the page buffers PB1 to PBn through data lines DL, or may exchange data with the input/output circuit 125 through column lines CL.

The input/output circuit 125 may transfer the command CMD and the address ADD received from the memory controller 200 to the control logic 130, or may exchange data DATA with the column decoder 124.

During the read operation or the verify operation, the sensing circuit 126 may generate a reference current in response to a permission bit signal VRY_BIT<#>. Further, the sensing circuit 126 may compare a sensing voltage VPB received from the page buffer group 123 with a reference voltage generated by the reference current to output a pass signal PASS or a fail signal FAIL.

The control logic 130 may output the operation signal OP_CMD, the row address RADD, the page buffer control signals PBSIGNALS, and the permission bit VRY_BIT<#> in response to the command CMD and the address ADD to control the peripheral circuit 120.

The control logic 130 may include the program operation controller 131.

The program operation controller 131 may determine that the program operation failed even though verification for all target program states is completed.

Specifically, while the program operation is performed, the program operation controller 131 may store the first pass loop counts and the second pass loop counts corresponding to each of the plurality of program states.

When the program operation is completed, the program operation controller 131 may calculate the difference values between the first pass loop counts and the second pass loop counts, respectively. Further, the program operation controller 131 may determine whether the program operation passed or failed according to whether any of the difference values exceeds the set reference value.

The first pass loop count may indicate a program loop in which memory cells on which the verify operation corresponding to each program state is passed are first sensed.

The second pass loop count may indicate a program loop in which the verification for the target program state is completed.

Figure 3:
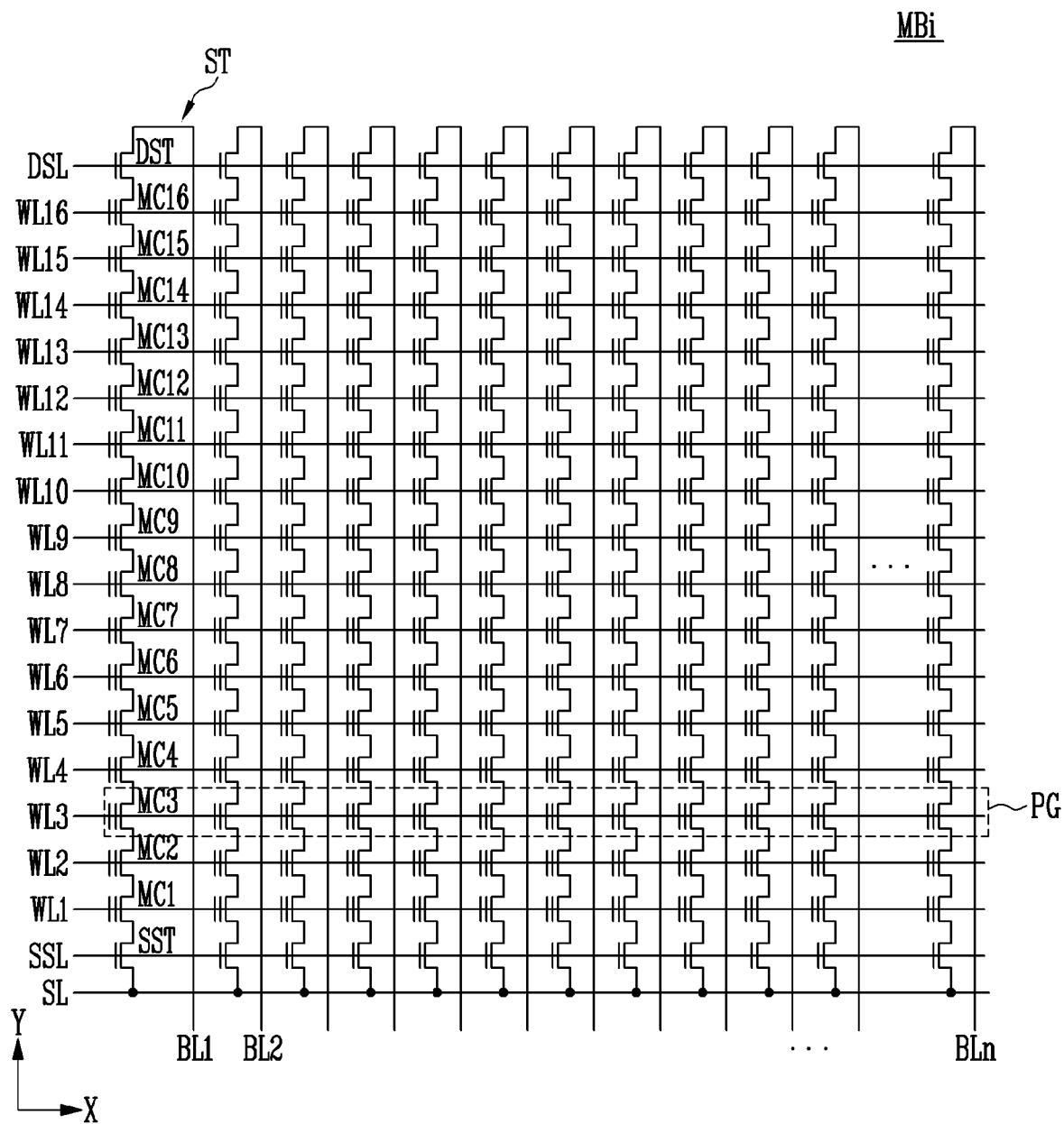
FIG. 3 is a diagram illustrating an embodiment of a structure of a representative memory block shown in FIG. 2.

FIG. 3 is a diagram illustrating an embodiment of a structure of a representative memory block MBi of the plurality of memory blocks shown in FIG. 2.

Referring to FIGS. 2 and 3, the memory block MBi shown in FIG. 3 may be any one of the memory blocks MB1 to MBk of FIG. 2.

The memory block MBi may include a first select line, a second select line, a plurality of word lines WL1 to WL16, a source line SL, a plurality of bit lines BL1 to BLn, and a plurality of strings ST.

The first select line may be, for example, a source select line SSL. Hereinafter, it is assumed that the first select line is the source select line SSL.

The second select line may be, for example, a drain select line DSL. Hereinafter, it is assumed that the second select line is the drain select line DSL.

The plurality of word lines WL1 to WL16 may be arranged in parallel between the source select line SSL and the drain select line DSL.

The number of word lines WL1 to WL16 shown in FIG. 3 is an example, and the number of word lines is not limited 16. Hereinafter, by way of example, it is assumed that the number of the plurality of word lines is 16.

The source line SL may be commonly connected to the plurality of strings ST.

The plurality of bit lines BL1 to BLn may be connected to the strings ST, respectively.

The plurality of strings ST may be connected to the bit lines BL1 to BLn and the source line SL.

Since the strings ST may be configured to be identical to each other, the string ST connected to the first bit line BL1 is specifically described as an example.

The string ST may include a plurality of memory cells MC1 to MC16, at least one first select transistor, and at least one second select transistor.

The plurality of memory cells MC1 to MC16 may be connected in series between a source select transistor SST and a drain select transistor DST.

Gates of the memory cells MC1 to MC16 may be connected to the plurality of word lines WL1 to WL16, respectively. Therefore, the number of memory cells MC1 to MC16 included in one string ST may be the same as the number of word lines WL1 to WL16. Hereinafter, by way of example, it is assumed that there are 16 memory cells, which is the same as the number of word lines WL1 to WL16.

Any one of the plurality of memory cells MC1 to MC16 may be configured as any one of the SLC, the MLC, the TLC, and the QLC.

A group of memory cells connected to the same word line among memory cells included in different strings ST may be referred to as a physical page PG. Therefore, the memory block MBi may include the physical pages PG corresponding to the number of word lines WL1 to WL16. Hereinafter, it is assumed that memory cells (for example, MC3) included in the physical page PG are selected memory cells.

The first select transistor may be, for example, a source select transistor SST. Hereinafter, it is assumed that the first select transistor is the source select transistor SST.

A first electrode of the source select transistor SST may be connected to the source line SL. A second electrode of the source select transistor SST may be connected to the first memory cell MC1 among the plurality of memory cells MC1 to MC16. A gate electrode of the source select transistor SST may be connected to the source select line SSL.

The second select transistor may be, for example, a drain select transistor DST. Hereinafter, it is assumed that the second select transistor is the drain select transistor DST.

A first electrode of the drain select transistor DST may be connected to the sixteenth memory cell MC16 among the plurality of memory cells MC1 to MC16. A second electrode of the drain select transistor DST may be connected to the first bit line BL1. A gate electrode of the drain select transistor DST may be connected to the drain select line DSL.

Figure 4:
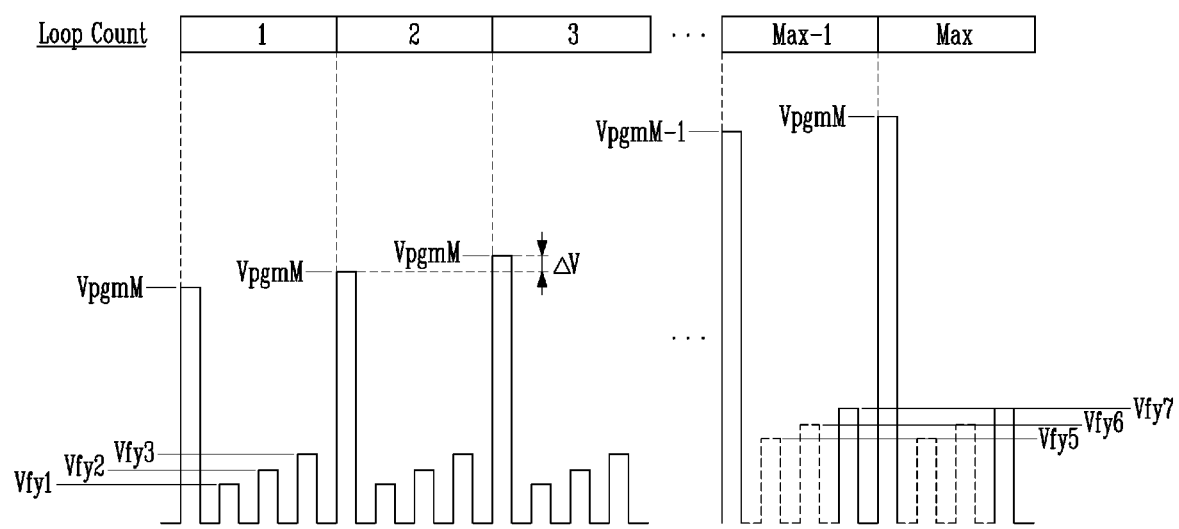
FIG. 4 is a diagram illustrating a program operation and a verify operation executed in a program loop according to an embodiment of the present disclosure.

FIG. 4 is a diagram illustrating a program operation and a verify operation executed in a program loop according to an embodiment of the present disclosure.

Referring to FIG. 4, the program operation may include a plurality of program loops.

A value of each program loop may be its program loop count. For example, a value of a first program loop may be 1, a value of a second program loop may be 2, and a value of a third program loop may be 3.

Each program loop may include the program voltage application operation and the verify operation.

The program voltage application operation may be include applying a program voltage Vpgm to the selected word line.

For example, when the first program state is an erase state, a first program voltage application operation in the first program loop may include applying a first program voltage Vpgm1 to a memory cell programmed with a second program state as a target program state. For example, a second program voltage application operation in the second program loop may include applying a second program voltage Vpgm2 to a memory cell programmed with a third program state as the target program state. For example, a third program voltage application operation in the third program loop may include applying a third program voltage Vpgm3 to a memory cell programmed with a fourth program state as the target program state.

The verify operation may include determining whether a threshold voltage Vth of the memory cell reaches the target threshold voltage. In the verify operation, a verify voltage Vfy corresponding to the target program state may be applied to the selected word line.

For example, when the first program state is the erase state, the first verify operation in each of the first to third program loops may be an operation of determining whether the threshold voltage Vth of the memory cell reaches the target threshold voltage corresponding to the second program state that is the target program state. In addition, in the first verify operation, a first verify voltage Vfy1 corresponding to the second program state may be applied. The second verify operation in each of the first to third program loops may be an operation of determining whether the threshold voltage Vth of the memory cell reaches the target threshold voltage corresponding to the third program state that is the target program state. In addition, in the second verify operation, a second verify voltage Vfy2 corresponding to the third program state may be applied. However, the present disclosure is not limited thereto.

When the threshold voltage Vth of the memory cell is greater than the verify voltage Vfy, the verify operation passed. When the threshold voltage Vth of the memory cell is less than or equal to the verify voltage Vfy, the verify operation failed.

When the verify operation on a set number of memory cells among memory cells having the same target program state passed, verification for the corresponding target program state may be completed.

When verification for all target program states is completed, the program operation may be completed. When the program operation is completed, it may be determined that the program operation passed.

When the program operation does not pass within a set reference time, it may be determined that the program operation failed. Alternatively, when the program operation has not passed even after the program loop is performed the maximum number of times, as indicated by the set maximum loop count Max, it may be determined that the program operation failed.

The program voltage Vpgm may be provided according to an incremental step pulse program (ISPP) method. The program voltage Vpgm may be increased by a set step voltage $\Delta V$ each time the program loop is repeated. That is, the program voltage Vpgm may be sequentially increased from the first program voltage Vpgm1 to an M-th program voltage VpgmM.

At least one verify voltage Vfy in one program loop may be applied after the program voltage Vpgm is applied. Specifically, in the program loop, at least one verify voltage (for example, Vfy1) among the plurality of verify voltages Vfy1 to Vfy7 may be applied after the program voltage Vpgm is applied.

Application of the program voltages Vpgm1 to VpgmM and the verify voltages Vfy1 to Vfy7 may be repeated up to the maximum loop count Max.

Figure 5:
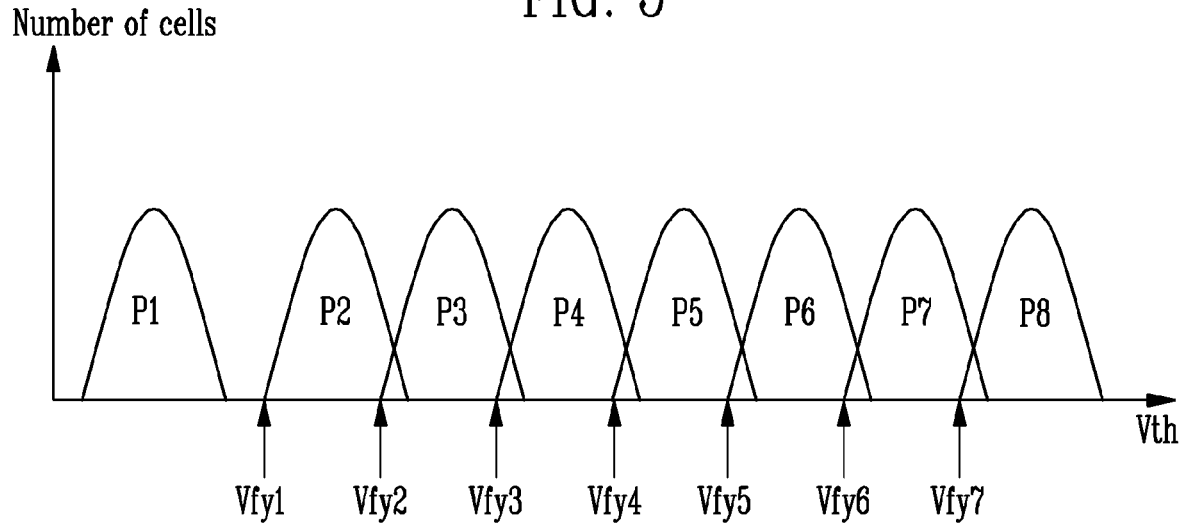
FIG. 5 is a diagram illustrating a program state according to an embodiment of the present disclosure.

FIG. 5 is a diagram illustrating a program state according to an embodiment of the present disclosure.

FIG. 5 is described in the context of a TLC that stores 3 bits of data.

Referring to FIG. 5, the target program state may be any one of the plurality of program states, i.e., P1 to P8. The first program state P1 may be, for example, an erase state.

The memory cells may have a threshold voltage belonging to a threshold voltage distribution corresponding to any one of the program states P1 to P8 through the program operation.

Before the program operation is performed, the memory cells may be in the first program state P1. In an embodiment, the first program state P1 may be a state of memory cells after the erase operation is performed.

Since the program voltage Vpgm is increased by a set step voltage $\Delta V$ each time a successive program loop is repeated, the threshold voltage Vth of the memory cells may be changed according to the program voltage Vpgm. The threshold voltage Vth of the memory cells may increase as the program voltage application operation progresses. In addition, a threshold voltage distribution corresponding to the state of the memory cells after the erase operation is performed may be changed as the program voltage application operation is progressed. Specifically, the threshold voltage distribution corresponding to the state of the memory cells after the erase operation is performed may be changed (or moved) in a direction in which the threshold voltage Vth increases.

As the program voltage application operation progresses, the verify operation may be sequentially performed from the second program state P2 to the eighth program state P8.

The verify operation corresponding to the second program state P2 may include determining whether the threshold voltage of the memory cell reaches the target threshold voltage corresponding to the second program state P2 that is the target program state. The verify voltage corresponding to the second program state P2 may be the first verify voltage Vfy1. That is, the target threshold voltage corresponding to the second program state P2 may be the first verify voltage Vfy1. During the verify operation using the first verify voltage Vfy1, memory cells having a threshold voltage Vth greater than the first verify voltage Vfy1 may be in an off state (or may be an off cell). During the verify operation using the first verify voltage Vfy1, memory cells having a threshold voltage Vth less than or equal to the first verify voltage Vfy1 may be in an on state (or may be an on cell).

The verify operations corresponding to the third to eighth program states P3 to P8 may include determining whether the threshold voltage of the memory cell reaches the target threshold voltages corresponding to the target program states (for example, the third to eighth program states P3 to P8). In this case, the verify voltages corresponding to the third to eighth program states P3 to P8 may be second to seventh verify voltages Vfy2 to Vfy7.

Figure 6:
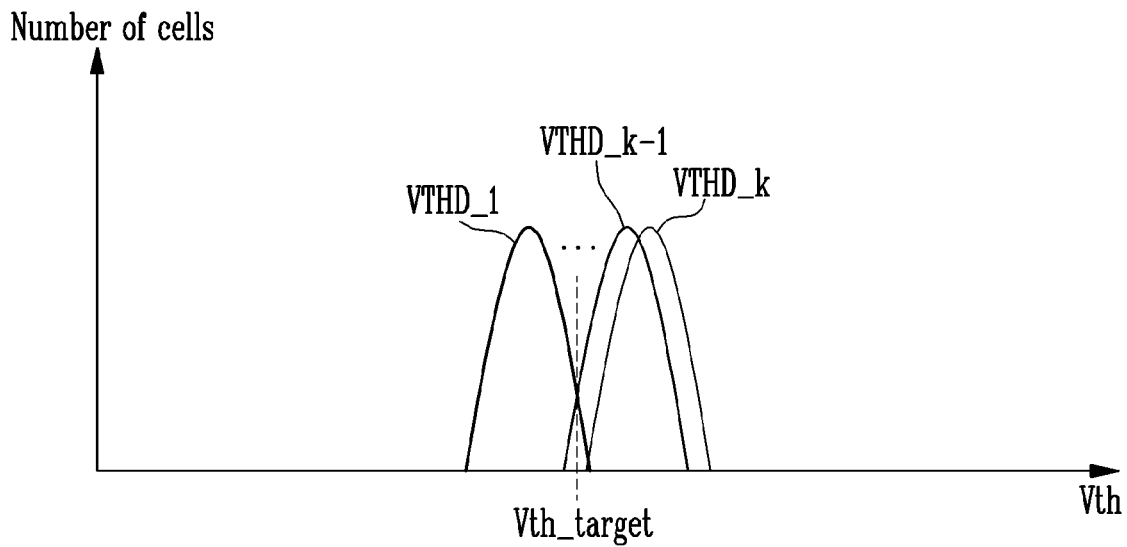
FIG. 6 is a diagram illustrating pass loop counts according to an embodiment of the present disclosure.

FIG. 6 is a diagram illustrating pass loop counts according to an embodiment of the present disclosure.

Referring to FIG. 6, a threshold voltage distribution corresponding to any one program state (for example, P3) among the second to eighth program states P2 to P8 is described.

In FIG. 6, as the program loops, each including the program voltage application operation of applying the program voltage (for example, Vpgm2) for the program state (for example, P3) and the verify operation of applying the verify voltage (for example, Vfy2) for the program state (for example, P3) are repeated, a threshold voltage distribution VTHD of the memory cells may be changed in a sequence from a first threshold voltage distribution VTHD_1 to a k-th threshold voltage distribution VTHD_k.

In an embodiment, the first pass loop count may be a value of a program loop in which memory cells on which a verify operation corresponding to each program state is passed are first sensed.

Referring to FIGS. 4 to 6, for example, according to the second program voltage application operation in the second program loop, the second program voltage Vpgm2 may be applied to the selected memory cells.

The threshold voltage distribution VTHD of memory cells to be programmed to the third program state P3 may be changed to the first threshold voltage distribution VTHD_1 from a target voltage distribution corresponding to the state (for example, P1) of the memory cells after the erase operation is performed.

In the second verify operation in the second program loop, a target threshold voltage Vth_target corresponding to the third program state P3, that is, the second verify voltage Vfy2 for verifying the third program state P3, may be applied to the selected memory cells. At least one memory cell having a threshold voltage Vth greater than the second verify voltage Vfy2 among the threshold voltages Vth belonging to the first threshold voltage distribution VTHD_1 may be first sensed. That is, the second verify operation in the second program loop may be first passed. In this case, the first pass loop count may be 2, which is the value of the second program loop.

In an embodiment, the first pass loop count may be a value of a program loop in which a verify operation on a first set reference number of memory cells among memory cells having the same target program state passed.

For example, during the second verify operation in the second program loop, memory cells of the number less than the first reference number of memory cells to be programmed to the third program state pass the second verify operation. During the second verify operation in the third program loop, when the first reference number of memory cells among the memory cells to be programmed to the third program state pass the second verify operation, the first pass loop count may be 3, which is the value of the third program loop.

In an embodiment, the second pass loop count may be a program loop in which verification for the target program state is completed. When the verify operation on the second reference number of memory cells among the memory cells having the same target program state is passed, verification for the corresponding target program state may be completed.

Referring to FIGS. 4 to 6, for example, according to a third program voltage application operation in the third program loop, the third program voltage Vpgm3 may be applied to the selected memory cells.

The threshold voltage distribution VTHD of the memory cells to be programmed to the third program state P3 may be changed from a target voltage distribution corresponding to the state (for example, P1) of the memory cells after the erase operation is performed to the k-th threshold voltage distribution VTHD_k.

In the second verify operation included in the third program loop, the second verify voltage Vfy2 may be applied to the selected memory cells. Among the threshold voltages Vth belonging to the k-th threshold voltage distribution VTHD_k, the second reference number of memory cells having a threshold voltage Vth greater than the second verify voltage Vfy2 may be sensed. That is, the second verify operation in the third program loop may be finally passed. Therefore, since verification for the third program state is completed, the second pass loop count may be 3, which is the value of the third program loop.

In an embodiment, the first reference number may be less than the second reference number.

Figures 7, 8:
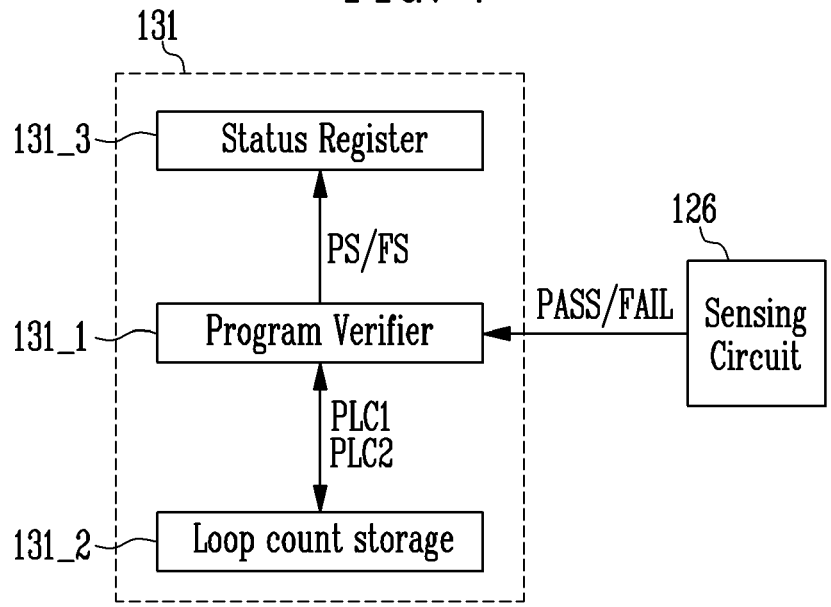
FIG. 7 is a diagram illustrating an embodiment of a program operation controller shown in FIG. 2.
FIG. 8 is a diagram illustrating first pass loop counts and second pass loop counts stored in a loop count storage, such as that shown in FIG. 7.

FIG. 7 is a diagram illustrating an embodiment of the program operation controller 131 shown in FIG. 2.

Referring to FIG. 7, the program operation controller 131 may include a program verifier 131_1, a loop count storage 131_2, and a status register 131_3.

The program verifier 131_1 may receive the pass signal PASS or the fail signal FAIL.

The program verifier 131_1 may detect a first pass loop count PLC1 and a second pass loop count PLC2 corresponding to one program state in response to the pass signal PASS or the fail signal FAIL. In addition, the program verifier 131_1 may detect first pass loop counts PLC1 and second pass loop counts PLC2 corresponding to the plurality of program states.

The program verifier 131_1 may provide the first pass loop counts PLC1 and the second pass loop counts PLC2 to the loop count storage 131_2.

The loop count storage 131_2 may store the first pass loop counts PLC1 and the second pass loop counts PLC2 corresponding to each of the plurality of program states determined while the program operation is performed.

When the program operation is completed, the program verifier 131_1 may receive the first pass loop counts PLC1 and the second pass loop counts PLC2 stored in the loop count storage 131_2.

When the program operation is completed, the program verifier 131_1 may calculate a difference value between the first pass loop count PLC1 and the second pass loop count PLC2 corresponding to one program state. That is, the program verifier 131_1 may calculate difference values between corresponding PLC1 and PLC2 pairs with respect to the plurality of program states.

The program verifier 131_1 may output a result of performing the program operation according to whether a difference value exceeding a set reference value is present among the difference values. The result of performing the program operation may indicate any one status of a pass status PS or a fail status FS.

The reference value may be stored in the program verifier 131_1, but the invention is not limited thereto.

In an embodiment, the program verifier 131_1 may output the result of performing the program operation indicating the fail status FS in response to presence of the difference value exceeding the reference value. That is, when at least one difference value exceeding the reference value is present, the program verifier 131_1 may output the result of performing the program operation indicating the fail status FS.

In an embodiment, the program verifier 131_1 may output the result of performing the program operation indicating the pass status PS in response to all difference values being less than or equal to the reference value.

The program verifier 131_1 may provide the result of performing the program operation indicating the pass status PS or the fail status FS to the status register 131_3.

The status register 131_3 may store the result of performing the program operation, which may indicate the pass status PS or the fail status FS.

FIG. 8 is a diagram illustrating first pass loop counts and second pass loop counts stored in the loop count storage shown in FIG. 7.

In FIG. 8, PV1 to PV7 may respectively correspond to second to eighth program states P2 to P8 described with reference to FIG. 5.

In describing FIG. 8, as described above with reference to FIG. 5, the selected memory cells are triple-level cells, and thus the present embodiments are described in the context in which the number of the plurality of program states is eight.

Referring to FIGS. 7 and 8, the loop count storage 131_2 may store the first pass loop count PLC1 and the second pass loop count PLC2 for each of the plurality of program states P1 to P8. In addition, the first pass loop counts PLC1 and the second pass loop counts PLC2 have a value of the program loop.

For example, the first pass loop count PLC1 for the second program state P2 or PV1 may be x1, and the second pass loop count PLC2 for the second program state P2 or PV1 may be y1. For example, the first pass loop count PLC1 for the third program state P3 or PV2 may be x2, and the second pass loop count PLC2 for the third program state P3 or PV2 may be y2. For example, the first pass loop count PLC1 for the fourth program state P4 or PV3 may be x3, and the second pass loop count PLC2 for the fourth program state P4 or PV3 may be y3. For example, the first pass loop count PLC1 for the fifth program state P5 or PV4 may be x4, and the second pass loop count PLC2 for the fifth program state P5 or PV4 may be y4. For example, the first pass loop count PLC1 for the sixth program state P6 or PV5 may be x5, and the second pass loop count PLC2 for the sixth program state P6 or PV5 may be y5. For example, the first pass loop count PLC1 for the seventh program state P7 or PV6 may be x6, and the second pass loop count PLC2 for the seventh program state P7 or PV6 may be y6. For example, the first pass loop count PLC1 for the eighth program state P8 or PV7 may be x7, and the second pass loop count PLC2 for the eighth program state P8 or PV7 may be y7.

When the program operation is completed, the program verifier 131_1 may calculate difference values (|PLC1−PLC2|) between corresponding first pass loop counts PLC1 and the second pass loop counts PLC2 from the loop count storage 131_2. In an embodiment, the second pass loop count PLC2 may be greater than or equal to the first pass loop count PLC1. Hereinafter, it is assumed that the second pass loop count PLC2 is greater than or equal to the first pass loop count PLC1.

For example, the program verifier 131_1 may calculate a difference value (y1−x1) between the first pass loop count PLC1 and the second pass loop count PLC2 for the second program state P2 or PV1. For example, the program verifier 131_1 may calculate a difference value (y2−x2) between the first pass loop count PLC1 and the second pass loop count PLC2 for the third program state P3 or PV2. For example, the program verifier 131_1 may calculate a difference value (y3−x3) between the first pass loop count PLC1 and the second pass loop count PLC2 for the fourth program state P4 or PV3. For example, the program verifier 131_1 may calculate a difference value (y4−x4) between the first pass loop count PLC1 and the second pass loop count PLC2 for the fifth program state P5 or PV4. For example, the program verifier 131_1 may calculate a difference value (y5−x5) between the first pass loop count PLC1 and the second pass loop count PLC2 for the sixth program state P6 or PV5. For example, the program verifier 131_1 may calculate a difference value (y6−x6) between the first pass loop count PLC1 and the second pass loop count PLC2 for the seventh program state P7 or PV6. For example, the program verifier 131_1 may calculate a difference value (y7−x7) between the first pass loop count PLC1 and the second pass loop count PLC2 for the eighth program state P8 or PV7.

The program verifier 131_1 may store the result of performing the program operation in the status register 131_3 according to whether a difference value exceeding a set reference value is present among the difference values (y1−x1), (y2−x2), (y3−x3), (y4−x4), (y5−x5), (y6−x6), and (y7−x7).

For example, the program verifier 131_1 may store the result of performing the program operation, which indicates the fail status FS, in the status register 131_3 according to at least one difference value exceeds the set reference value among the difference values (y1−x1), (y2−x2), (y3−x3), (y4−x4), (y5−x5), (y6−x6), and (y7−x7).

For example, the program verifier 131_1 may store the result of performing the program operation, which indicates the pass status PS, in the status register 131_3 according to all difference values (y1−x1), (y2−x2), (y3−x3), (y4−x4), (y5−x5), (y6−x6), and (y7−x7) being less than or equal to the reference value.

Figure 9:
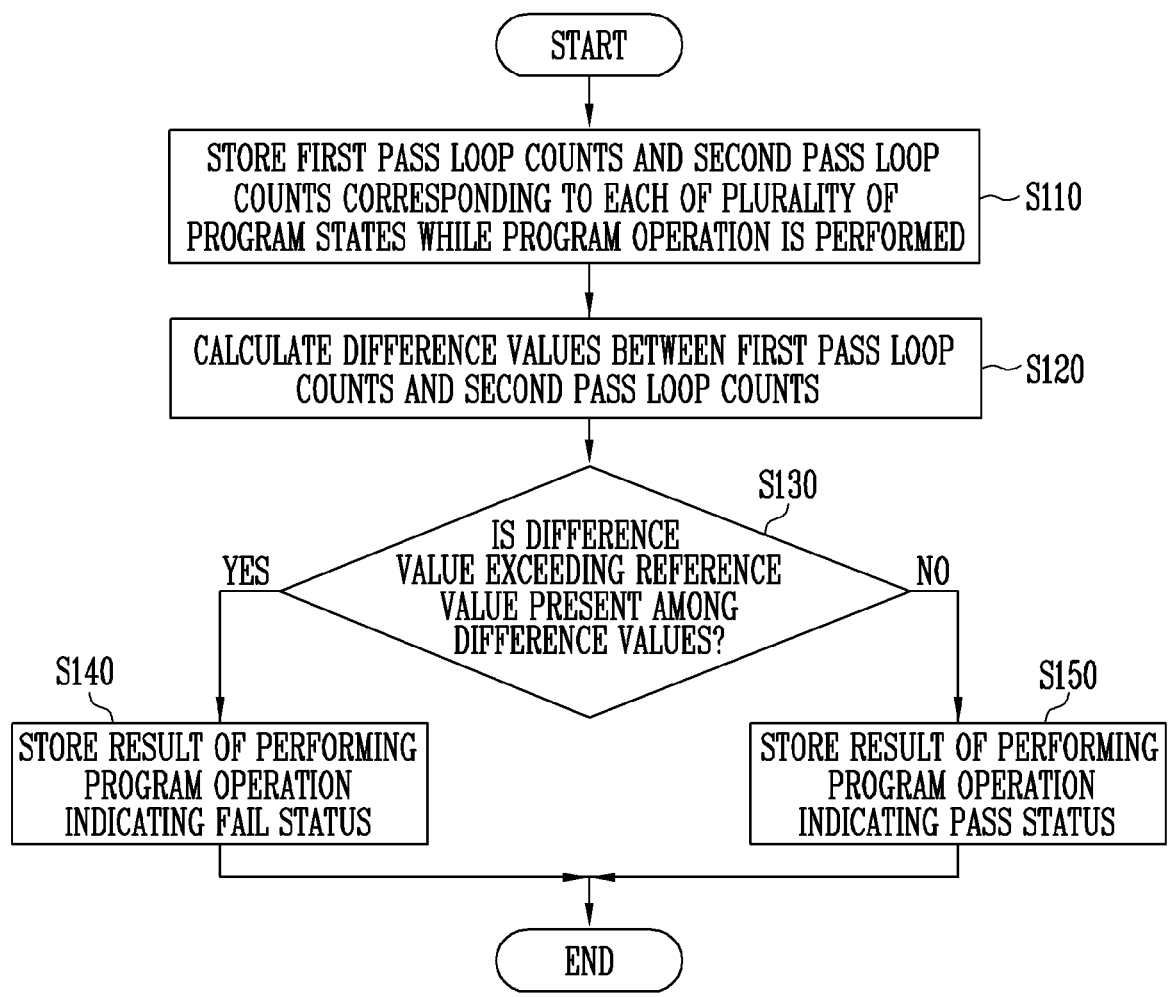
FIG. 9 is a flowchart illustrating an embodiment of a method of operating a memory device, such as that shown in FIG. 1.

FIG. 9 is a flowchart illustrating an embodiment of a method of operating the memory device 100 shown in FIG. 1.

Referring to FIG. 9, the memory device 100 stores the first pass loop counts PLC1 and the second pass loop counts PLC2 corresponding to each of the plurality of program states, as shown in FIG. 8, while the program operation is performed (S110).

When the program operation is completed, the memory device 100 calculates the difference values (y1−x1), (y2−x2), (y3−x3), (y4−x4), (y5−x5), (y6−x6), and (y7−x7) between the first pass loop count PLC1 and the second pass loop count PLC2, as shown in FIG. 8 (S120).

The memory device 100 determines whether at least one of the difference values exceeds the set reference value among the difference values (y1−x1), (y2−x2), (y3−x3), (y4−x4), (y5−x5), (y6−x6), and (y7−x7) (S130).

When at least one of the difference values exceeds the reference value (S130, YES), the memory device 100 stores the result of performing the program operation indicating fail status FS (S140).

When none of the difference values exceed the reference value, that is, each of the difference values (y1−x1), (y2−x2), (y3−x3), (y4−x4), (y5−x5), (y6−x6), and (y7−x7) is less than or equal to the reference value (S130, NO), the memory device 100 stores the result of performing the program operation indicating pass status PS (S150).

Figure 10:
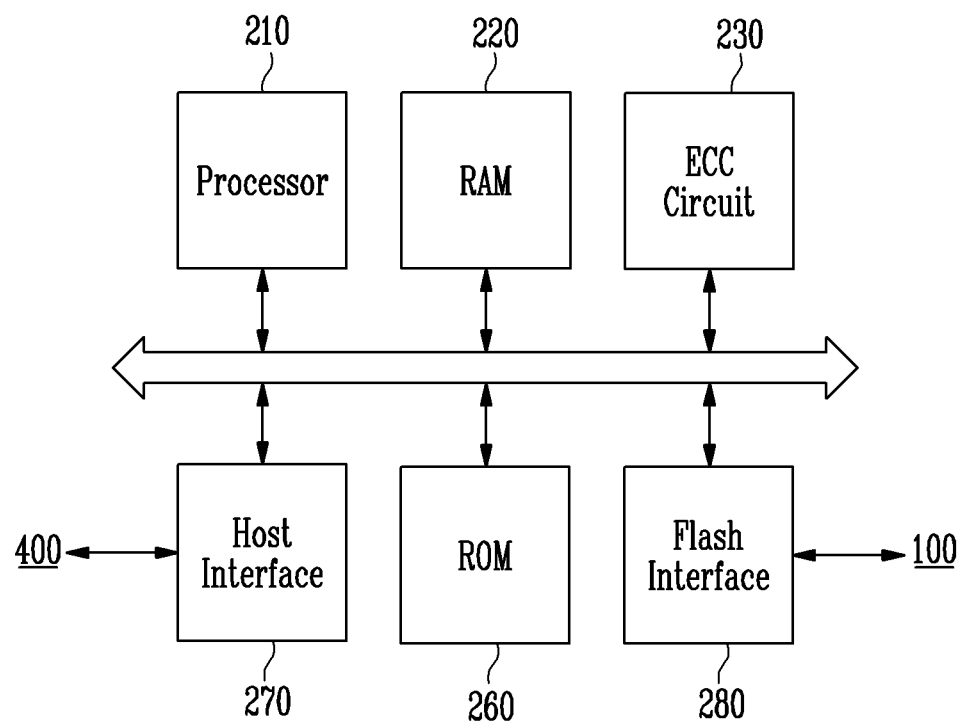
FIG. 10 is a diagram illustrating an embodiment of a memory controller, such as that shown FIG. 1.

FIG. 10 is a diagram for describing an embodiment of the memory controller 200 shown FIG. 1.

Referring to FIGS. 1 and 10, the memory controller 200 may include a processor 210, a random access memory (RAM) 220, an error correction circuit (i.e., ECC circuit) 230, a read only memory (ROM) 260, a host interface 270, and a flash interface 280.

The processor 210 may control overall operation of the memory controller 200. The RAM 220 may be used as a buffer memory, a cache memory, and an operation memory of the memory controller 200. Instead of the RAM 220, a static random access memory (SRAM) may be used as the buffer memory.

The ROM 260 may store various information for the memory controller 200 to operate via firmware.

The memory controller 200 may communicate with an external device (for example, the host 400, an application processor, and the like) through the host interface 270.

The memory controller 200 may communicate with the memory device 100 through the flash interface 280. The memory controller 200 may transmit a command CMD, an address ADDR, and a control signal CTRL to the memory device 100 and receive data DATA through the flash interface 280.

For example, the flash interface 280 may include a NAND interface.

Figure 11:
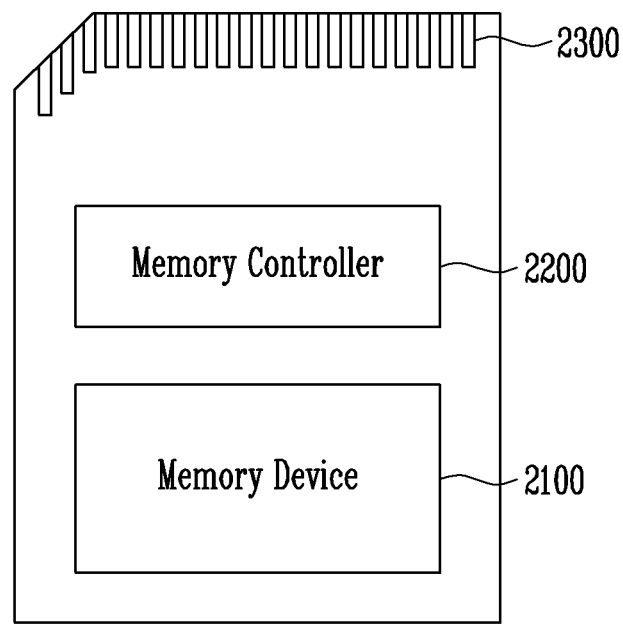
FIG. 11 is a block diagram illustrating a memory card system to which the storage device is applied according to an embodiment of the present disclosure.

FIG. 11 is a block diagram illustrating a memory card system 2000 to which the storage device is applied according to an embodiment of the present disclosure.

Referring to FIGS. 1 and 11, the memory card system 2000 includes a memory device 2100, a memory controller 2200, and a connector 2300.

For example, the memory device 2100 may be configured as any of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2200 is connected to the memory device 2100. The memory controller 2200 is configured to access the memory device 2100. For example, the memory controller 2200 may be configured to control read, write, erase, and background operations of the memory device 2100. The memory controller 2200 is configured to provide an interface between the memory device 2100 and the host 400. The memory controller 2200 is configured to drive firmware for controlling the memory device 2100. The memory controller 2200 may be implemented to the same as the memory controller 200 described with reference to FIG. 1.

For example, the memory controller 2200 may include components such as a random access memory (RAM), a processor, a host interface, a memory interface, and an error correction circuit.

The memory controller 2200 may communicate with an external device through the connector 2300. The memory controller 2200 may communicate with an external device (for example, the host 400) according to a specific communication standard. For example, the memory controller 2200 is configured to communicate with an external device through at least one of various communication standards such as a universal serial bus (USB), a multimedia card (MMC), an embedded MMC (eMMC), a peripheral component interconnection (PCI), a PCI express (PCI-e or PCIe), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

The memory device 2100 and the memory controller 2200 may be integrated into one semiconductor device to configure a memory card, such as a PC card (personal computer memory card international association (PCMCIA)), a compact flash card (CF), a smart media card (e.g., SM or SMC), a memory stick, a multimedia card (e.g., MMC, RS-MMC, MMCmicro, or eMMC), a secure digital (SD) card (e.g., SD, miniSD, microSD, or SDHC), and/or a universal flash storage (UFS).

Figure 12:
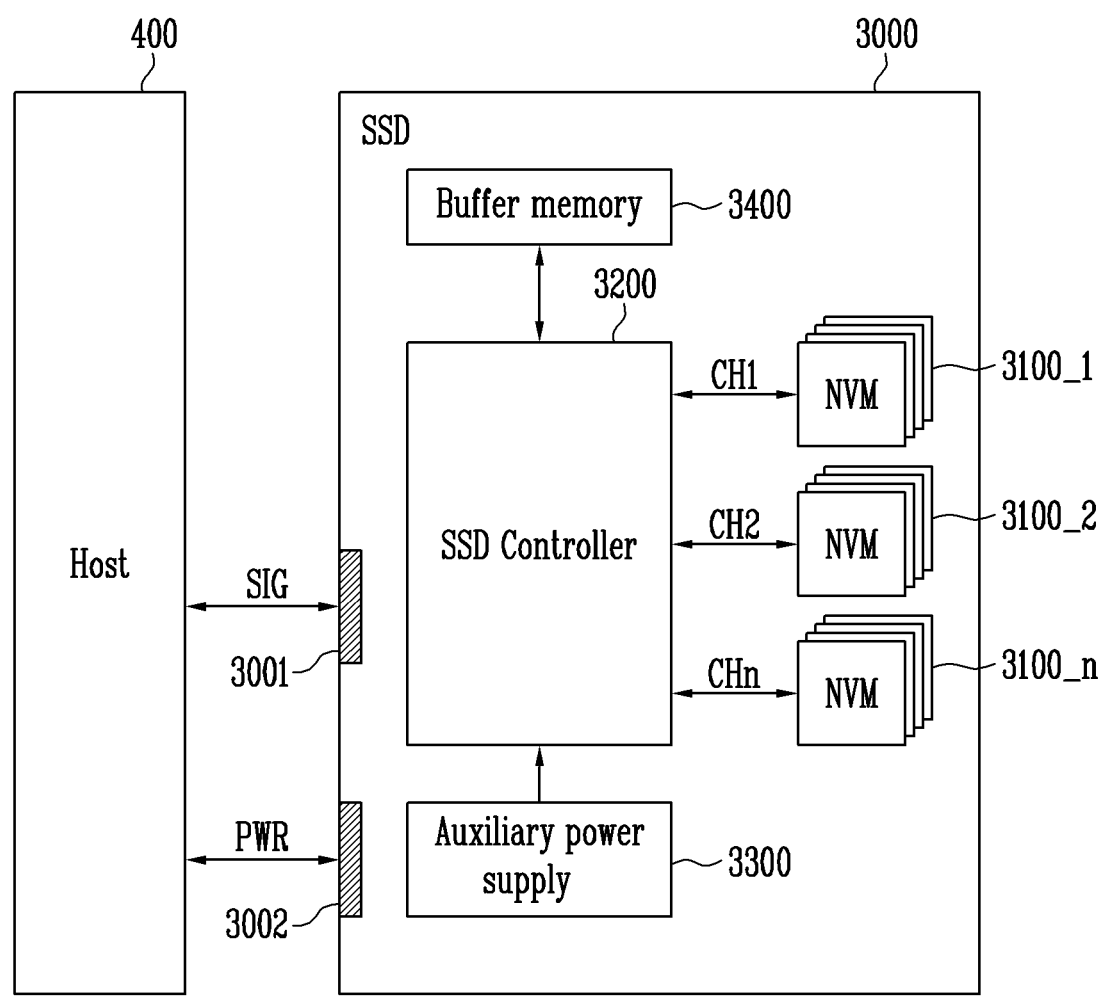
FIG. 12 is a block diagram illustrating a solid state drive (SSD) system to which the storage device is applied according to an embodiment of the present disclosure.

FIG. 12 is a block diagram illustrating a solid state drive (SSD) system 3000 to which the storage device is applied according to an embodiment of the present disclosure.

Referring to FIG. 12, the SSD system includes the host 400 and an SSD 3000.

The SSD 3000 exchanges a signal SIG with the host 400 through a signal connector 3001 and receives power PWR through a power connector 3002. The SSD 3000 includes an SSD controller 3200, a plurality of flash memories 3100_1, 3100_2, and 3100_n, an auxiliary power device 3300, and a buffer memory 3400.

According to an embodiment of the present disclosure, the SSD controller 3200 may perform the function of the memory controller 200 described with reference to FIG. 1.

The SSD controller 3200 may control the plurality of flash memories 3100_1, 3100_2, and 3100_n in response to the signal SIG received from the host 400. For example, the signal SIG may include signals based on an interface between the host 400 and the SSD 3000. For example, the signal SIG may be defined by at least one of interfaces such as a universal serial bus (USB), a multimedia card (MMC), an embedded MMC (eMMC), a peripheral component interconnection (PCI), a PCI express (PCI-e or PCIe), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3300 is connected to the host 400 through the power connector 3002. The auxiliary power device 3300 may receive the power PWR from the host 400 and may charge the power. The auxiliary power device 3300 may provide power of the SSD 3000 when power supply from the host 400 is not smooth. For example, the auxiliary power device 3300 may be disposed in or externally to the SSD 3000. For example, the auxiliary power device 3300 may be disposed on a main board and may provide auxiliary power to the SSD 3000.

The buffer memory 3400 may temporarily store data. For example, the buffer memory 3400 may temporarily store data received from the host 400 or data received from the plurality of flash memories 3100_1, 3100_2, and 3100_n, or may temporarily store meta data (for example, a mapping table) of the flash memories 3100_1, 3100_2, and 3100_n. The buffer memory 3400 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 13:
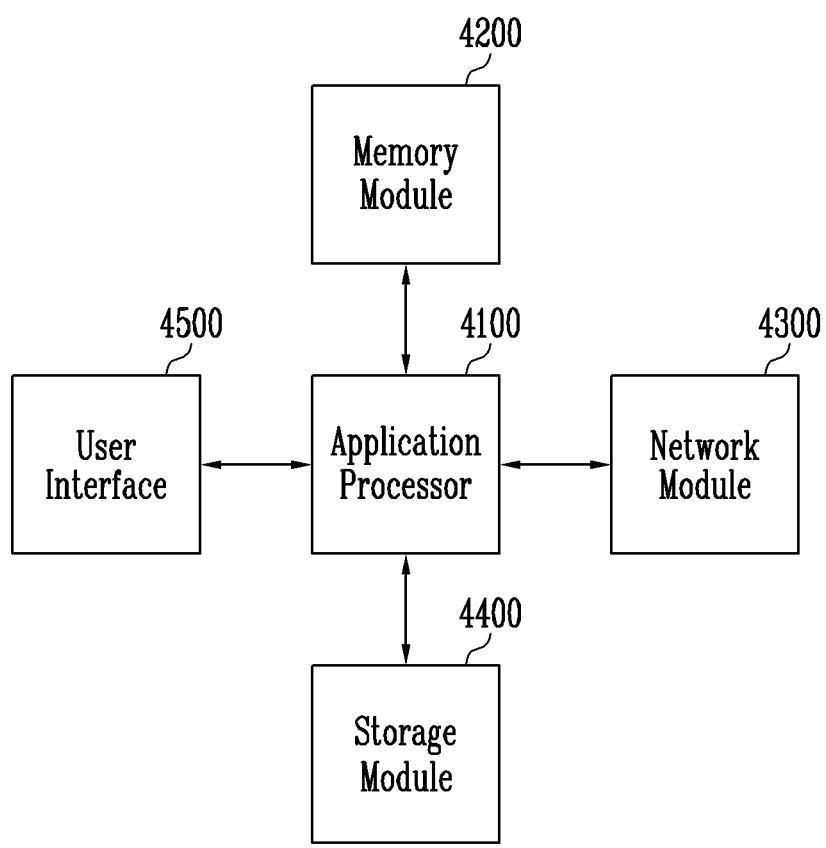
FIG. 13 is a block diagram illustrating a user system to which the storage device is applied according to an embodiment of the present disclosure.

FIG. 13 is a block diagram illustrating a user system 4000 to which the storage device is applied according to an embodiment of the present disclosure.

The user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDRAM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may operate identically to the storage device 1000 described with reference to FIG. 1. The storage module 4400 may include a plurality of non-volatile memory devices, each of which may operate identically to the memory device 100 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

While the present invention has been shown and described with reference to certain embodiments thereof, those skilled in the art will understand that various changes and/or modifications in form and details may be made to any of the disclosed embodiments without departing from the spirit and scope of the present invention.

For example, all steps need not necessarily be performed in the stated order, and in some cases, one or more steps, or portions thereof, may be omitted. Also, specific terminology used herein is intended to explain embodiments of the present disclosure, not to limit the invention. Thus, the present invention encompasses all changes and variations to the extent they fall within the scope of the claims.

What is claimed is:

1. A memory device comprising:
a memory cell array including a plurality of memory cells;
a peripheral circuit configured to perform a program operation of increasing a threshold voltage of the plurality of memory cells so that the threshold voltage of the plurality of memory cells is included in any one of a plurality of program states separated according to voltage magnitudes thereof;
a loop count storage configured to store first pass loop counts and second pass loop counts for the plurality of program states, respectively, the program states being determined while the program operation is performed; and
a program verifier configured to calculate difference values, each of which is between a first pass loop count and a second pass loop count of a respective one of the program states, when the program operation is completed, and output a result of the program operation indicating a pass status or a fail status according to whether at least one of the difference values exceeds a reference value.

2. The memory device of claim 1, wherein the program operation includes a plurality of program loops, and
the first pass loop counts indicate program loops in which a memory cell on which verify operations respectively corresponding to the plurality of program states have passed is first sensed.

3. The memory device of claim 2, wherein the second pass loop counts indicate program loops in which verification for each of the plurality of program states is completed.

4. The memory device of claim 3, wherein the second pass loop counts indicate program loops when memory cells on which verify operations respectively corresponding to the plurality of program states that have passed exceed a second reference number in verification for each target program state.

5. The memory device of claim 4, wherein the program operation includes a plurality of program loops, and
the first pass loop counts indicate program loops when memory cells in which verify operations respectively corresponding to the plurality of program states that have passed exceed a first reference number.

6. The memory device of claim 1, wherein the program verifier outputs a result of the program operation in a fail status when at least one of difference values exceeds the reference value among the difference values.

7. The memory device of claim 1, further comprising:
a status register configured to store a result of performing the program operation.

8. A method of operating a memory device, the method comprising:
performing a program operation of increasing a threshold voltage of a plurality of memory cells so that the threshold voltage of the plurality of memory cells in a memory cell array is included in any one of a plurality of program states separated according to voltage magnitudes thereof;
storing first pass loop counts and second pass loop counts for the plurality of program states, respectively, the program states being determined while the program operation is performed;
calculating difference values, each of which is between the first pass loop count and the second pass loop count of a respective one of the program states, when the program operation is completed; and determining whether the program operation passed or failed according to whether at least one of the difference values exceeds a reference value.

9. The method of claim 8, wherein the determining of whether the program operation passed or failed comprises:

generating a result of the program operation indicating that the program operation failed in response to at least one of the difference values exceeding the reference value; and storing the result of performing the program operation in a status register.

10. The method of claim 8, wherein the program operation includes a plurality of program loops, and the first pass loop counts indicate program loops in which a memory cell on which verify operations respectively corresponding to the plurality of program states have passed is first sensed.

11. The method of claim 10, wherein the second pass loop counts indicate program loops in which verification for each of the plurality of program states is completed.

12. The method of claim 10, wherein the second pass loop counts indicate program loops when memory cells on which verify operations respectively corresponding to the plurality of program states that have passed exceed a second reference number in verification for each target program state.

13. The method of claim 12, wherein the program operation includes a plurality of program loops, and the first pass loop counts indicate program loops when memory cells on which verify operations respectively corresponding to the plurality of program states that have passed exceed a first reference number.

14. A memory device comprising:

a plurality of memory cells;

a peripheral circuit configured to perform a program operation of increasing a threshold voltage of the plurality of memory cells so that the threshold voltage of the plurality of memory cells is included in any one of a plurality of program states separated according to voltage magnitudes thereof; and control logic configured to determine whether the program operation passed according to whether a difference between program loops in which a memory cell on which verify operations respectively corresponding to the plurality of program states passed is first sensed and program loops in which verification for each of the plurality of program states is completed exceeds a reference value, while the program operation is performed.

15. The memory device of claim 14, further comprising: a status register configured to store a result of the program operation.

* * * * *